US011727969B2

(12) United States Patent
Porzio et al.

(10) Patent No.: US 11,727,969 B2
(45) Date of Patent: *Aug. 15, 2023

(54) MEMORY SUB-SYSTEM MANAGING REMAPPING FOR MISALIGNED MEMORY COMPONENTS

(71) Applicant: Micron Technology, Inc., Boise, ID (US)

(72) Inventors: Luca Porzio, Casalnuovo di Napoli (IT); Marco Di Pasqua, Naples (IT); Paolo Papa, Naples (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/532,364

(22) Filed: Nov. 22, 2021

(65) Prior Publication Data

US 2022/0084572 A1    Mar. 17, 2022

Related U.S. Application Data

(63) Continuation of application No. 17/099,347, filed on Nov. 16, 2020, now Pat. No. 11,222,673, which is a
(Continued)

(51) Int. Cl.
*G11C 8/00* (2006.01)
*G11C 29/00* (2006.01)
(Continued)

(52) U.S. Cl.
CPC .............. *G11C 8/00* (2013.01); *G06F 11/073* (2013.01); *G06F 12/0238* (2013.01); *G06F 12/0292* (2013.01); *G11C 29/76* (2013.01)

(58) Field of Classification Search
CPC ... G11C 29/76; G06F 12/0292; G06F 11/073; G06F 12/0238
See application file for complete search history.

(56) References Cited

U.S. PATENT DOCUMENTS 7,376,861 B2  5/2008  Ko
10,839,878 B1  11/2020  Porzio et al.
(Continued)

FOREIGN PATENT DOCUMENTS

CN       1328325 A    12/2001
CN     110033809 A     7/2019
(Continued)

OTHER PUBLICATIONS

"Chinese Application Serial No. 202010868968.1, Voluntary Amendment Filed Jun. 28, 2021", w English Claims, 26 pgs.
(Continued)

*Primary Examiner* — Ajay Ojha
(74) *Attorney, Agent, or Firm* — Schwegman Lundberg & Woessner, P.A.

(57) ABSTRACT

A processing device of a system receives a request to access a selected sector in a memory component. The selected sector is associated with a sector number. The processing device determines a virtual block corresponding to the selected sector. The virtual block is associated with a misalignment factor and a misalignment counter. The processing device determines if the misalignment counter satisfies a threshold criterion. In response to the misalignment counter satisfying the threshold criterion, the processing device generates an updated sector number by shifting the sector number by the misalignment factor and performs the access to the selected sector using the updated sector number. In response to the misalignment counter not satisfying the threshold criterion, the processing device updates the misalignment counter and performs the access to the selected sector using the sector number.

20 Claims, 5 Drawing Sheets

Related U.S. Application Data continuation of application No. 16/553,506, filed on Aug. 28, 2019, now Pat. No. 10,839,878.

(51) Int. Cl.
  *G06F 11/07*    (2006.01)
  *G06F 12/02*    (2006.01)

(56)         References Cited

U.S. PATENT DOCUMENTS

| | | |
|---|---|---|
| 11,222,673 B2 | 1/2022 | Porzio et al. |
| 2003/0110343 A1 | 6/2003 | Hagiwara et al. |
| 2012/0151115 A1 | 6/2012 | Wolf et al. |
| 2021/0074343 A1 | 3/2021 | Porzio et al. |

FOREIGN PATENT DOCUMENTS

| | | |
|---|---|---|
| CN | 112445715 | 3/2021 |
| CN | 112445715 B | 8/2022 |
| CN | 115374021 A | 11/2022 |
| CN | 115391234 A | 11/2022 |
| WO | WO-2019109030 A1 | 6/2019 |

OTHER PUBLICATIONS

"Chinese Application Serial No. 202010868968.1, Office Action dated Oct. 15, 2021", w English translation, 9 pgs.

"U.S. Appl. No. 17/099,347, Supplemental Notice of Allowability dated Dec. 8, 2021", 2 pgs.

"Chinese Application Serial No. 202010868968.1, Response Filed Feb. 15, 2022 to Office Action dated Oct. 15, 2021", w English Claims, 16 pgs.

MEMORY SUB-SYSTEM MANAGING REMAPPING FOR MISALIGNED MEMORY COMPONENTS

PRIORITY APPLICATION

This application is a continuation of U.S. application Ser. No. 17/099,347, filed Nov. 16, 2020, which is a continuation of U.S. application Ser. No. 16/553,506, filed Aug. 28, 2019, now issued as U.S. Pat. No. 10,839,878, all of which are incorporated herein by reference in their entirety.

TECHNICAL FIELD

Embodiments of the disclosure relate generally to memory sub-systems, and more specifically, relate to a memory sub-system managing remapping for misaligned memory components.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to a memory sub-system managing remapping for misaligned memory components. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

Conventional memory sub-systems can suffer performance degradation due to misalignments between the logical addresses used by a host device and the logical addresses used by the memory device. This misalignment can be due to the host device using a starting address that is different from the first logical address internally set by the memory device. If the logical address used by the host is expressed in sectors (e.g., 512 bytes in size), the conventional memory sub-system can potentially internally map the 512-byte sector to a logical unit that is greater than one sector (e.g., 4 KB).

For example, some conventional memory sub-systems use legacy partitioning tools to configure storage partition tables using outdated partition schema. For example, some conventional memory sub-systems use floppy partition schema (derived from floppy disks). This results in the first available sector in the storage device to be sector #63. However, storage devices can be organized and aligned to virtual pages. Each of the virtual pages can be 4 kilobytes (KB) or a multiplier thereof. Using the legacy partitioning tool results in the first sector of a partition to be located after 32,256 bytes (i.e., 63×512 B), which is 31.5 KB after the starting sector (e.g., sector 0). If, for example, a storage device is granularized with 4 KB pages, the first access from the conventional memory subsystem will happen at page #7 in a mis-aligned manner.

Further, since modern filesystems use data granularization of 2 KB or 4 KB, it is very likely that each filesystem access to the storage device accessing 4 KB of data yields an access of at least two partial pages on the underlying storage device due to the misaligned partition table. For example, when a read request of 4 KB of data is received for a system with 4 KB virtual page size, the misaligned partition table (e.g., partition table size of 31.5 KB) will cause the request to be performed at sector #63 (=31.5 KB) of 4 KB. The internal flash translation layer (FTL) will read the last 512 B of page #7 and 3.5 KB from page #8. Thus, the request is fulfilled with two NAND read accesses. In contrast, when the read request of 4 KB of data is received for a system with 4 KB virtual page size, the aligned partition table (e.g., partition table size of 2 MB) will cause the request to be performed at sector #4096 (=2 MB) of 4 KB. The internal flash translation layer (FTL) will read the 4 KB from page #512. Thus, the request is fulfilled with one NAND read access. Accordingly, a misaligned partition table causes the internal storage medium to access at least two physical pages in a misaligned manner even if only one page of data is requested.

Aspects of the present disclosure address the above and other deficiencies by having a memory sub-system that detects a partition misalignment and relocates logical sectors to prevent performance loss due to misaligned partition tables. The memory sub-system can detect a memory component as a linear array of data organized in sectors (e.g., 512 bytes in size) and manages the relocation of sectors in virtual pages that are blocks of data. The virtual page size of each of the virtual pages can be, for example, 4 KB. The memory component can also be split into virtual blocks (e.g., 128 MB in size) that include the virtual pages.

The memory sub-system comprises a remap component that maintains, for each virtual block, a misalignment factor and a misalignment counter. Each time a request to access a sector in the virtual block is received, the remap component determines if the misalignment counter satisfies a threshold criterion to determine whether to apply the misalignment factor. For example, the threshold criterion can be that the misalignment counter be greater than a predetermined threshold. In this embodiment, the misalignment counter satisfies a threshold criterion when the misalignment counter is greater than the predetermined threshold and does not satisfy the threshold criterion when the misalignment counter is not greater than the predetermined threshold. When the remap component determines that the misalignment counter satisfies a threshold criterion, the remap component generates an updated sector number by shifting the sector number by the misalignment factor and performs the access to the selected sector using the updated sector number. In contrast, when the remap component determines that the misalignment counter does not satisfies a threshold criterion, the remap component updates the misalignment counter and performs the access to the selected sector using the sector number. To update the misalignment counter, the remap component compares the misalignment factor to the address misalignment of the sector. The remap component increments the misalignment counter when the misalignment factor is equal to the address misalignment of the sector and resets the misalignment counter when the misalignment factor is not equal to the address misalignment of the sector. The remap component also updates the misalignment factor by setting the misalignment factor to the misalignment of the selected sector when the misalignment factor is not equal to the address misalignment of the sector.

By maintaining the misalignment factor and the misalignment counter for each virtual block, the remap component detects misconfigured partition models and remaps the logical sectors. This allows the memory subsystem to reduce the number of accesses required to fulfil requests (e.g., read and write accesses), which further increases performance of the memory subsystem. In comparison, the performance can be increased up to twice that of conventional memory subsystems. In addition to the performance gain, with the reduction of the number of accesses to the memory component, the remap component can increase the lifespan of the memory component up to twice the lifetime expectation of conventional memory subsystems. An additional technical benefit afforded by the memory subsystem is that the misaligned partition table problem is addressed within the memory component without needing to implement changes at a system level.

Figure 1:
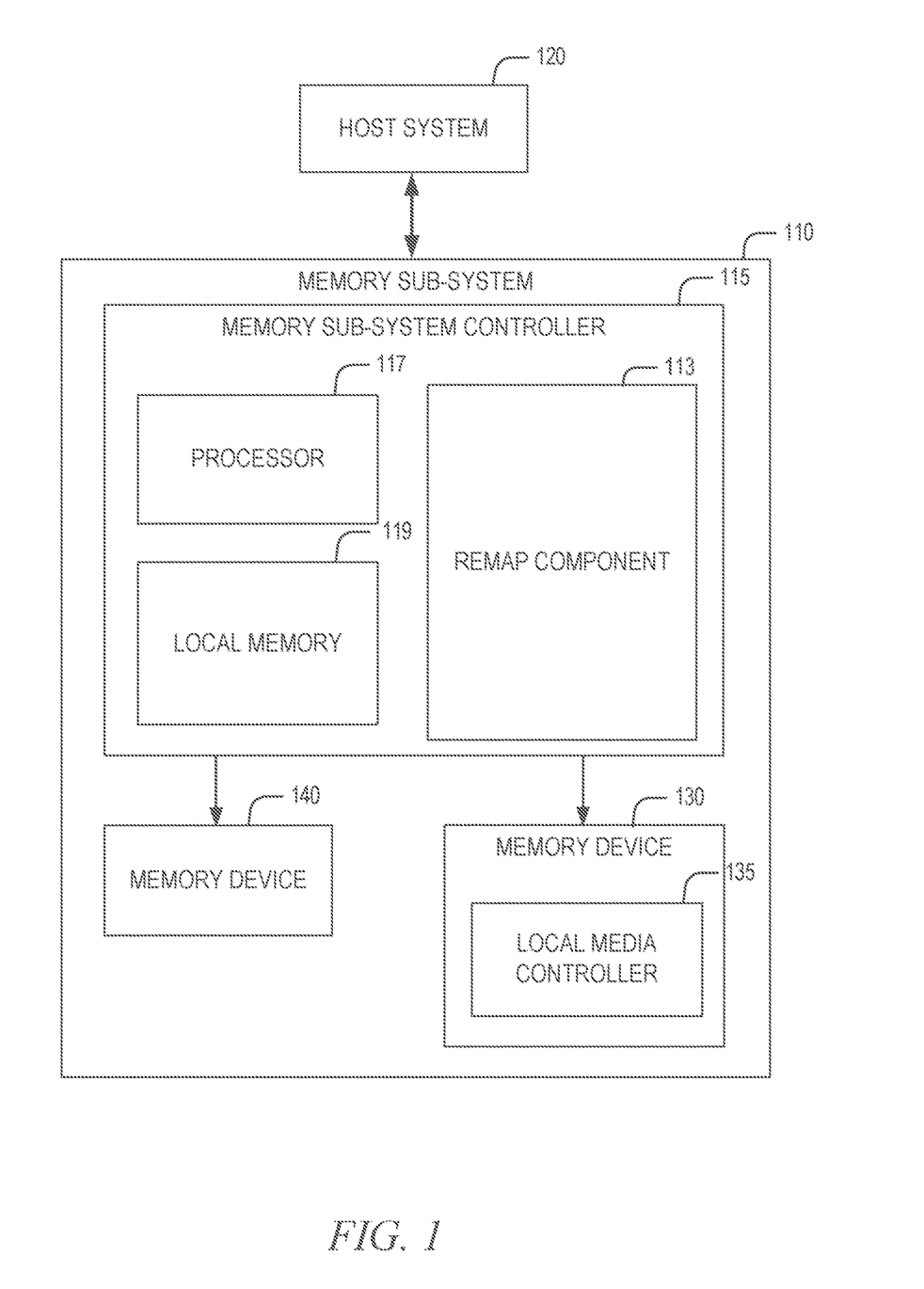
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single level cells (SLCs) or multi-level cells (MLCs) (e.g., triple level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data. For example, the memory cells in a memory device 130 can be grouped into virtual memory blocks (e.g., virtual blocks). Each of the virtual blocks can comprise virtual memory pages (e.g., virtual pages). Each of the virtual pages can comprise sectors of the memory device 130.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

The memory sub-system 110 includes a remap component 113 that can detect partition misalignments and remap logical sectors to improve the number of accesses required to fulfil requests (e.g., read and write accesses). In some embodiments, the memory sub-system controller 115 includes at least a portion of the remap component 113. For example, the memory sub-system controller 115 can include a processor 117 (processing device) configured to execute instructions stored in local memory 119 for performing the operations described herein. In some embodiments, the remap component 113 is part of the host system 120, an application, or an operating system.

The remap component 113 can perform remapping for a memory device 130 that has misaligned partition table using the misalignment factor and the misalignment counter that is maintained for each virtual block of memory cells in a memory device 130. Each time a request to access a sector in the virtual block is received, the remap component 113 determines if the misalignment counter of the virtual block is greater than a predetermined threshold to determine whether to apply the misalignment factor of the virtual block. When the remap component 113 determines that the misalignment counter is greater than the predetermined threshold, the remap component 113 generates an updated sector number by shifting the sector number by the misalignment factor and performs the access to the selected sector using the updated sector number. In contrast, when the remap component 113 determines that the misalignment counter is not greater than the predetermined threshold, the remap component 113 updates the misalignment counter and performs the access to the selected sector using the sector number. To update the misalignment counter, the remap component 113 compares the misalignment factor to the address misalignment of the sector. The remap component 113 increments the misalignment counter when the misalignment factor is equal to the address misalignment of the sector and resets the misalignment counter when the misalignment factor is not equal to the address misalignment of the sector. The remap component 113 also updates the misalignment factor by setting the misalignment factor to the misalignment of the selected sector when the misalignment factor is not equal to the address misalignment of the sector. Further details with regards to the operations of the remap component 113 are described below.

Figure 2:
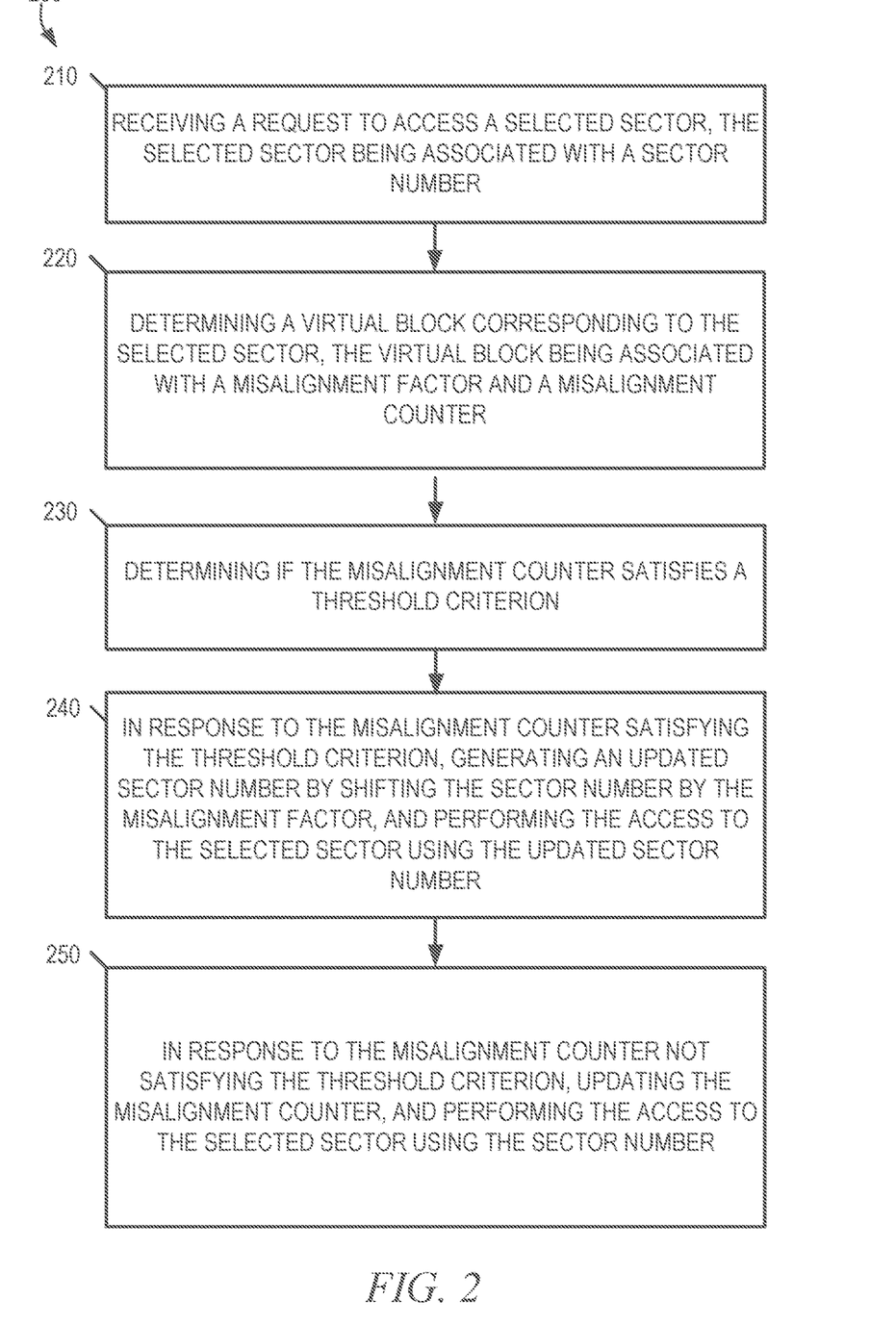
FIG. 2 is a flow diagram of an example method to manage remapping for a misaligned memory component in accordance with some embodiments of the present disclosure.

FIG. 2 is a flow diagram of an example method 200 to manage remapping for a misaligned memory component, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the remap component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing device receives a request to access a selected sector in a memory component. The memory component can include one or more sectors. Each sector in the memory component can be a block of data that is 512 bytes in size. The selected sector can be associated with a sector number. The selected sector can be identified using the sector number. In one embodiment, the request to access the selected sector includes the sector number.

The processing device, at operation 210, can receive the request to access the selected sector from a host system 120. The request to access the selected sector can be a read access or a write access.

The processing device then determines a virtual block corresponding to the selected sector (see operation 220). The virtual block can be associated with a misalignment factor and a misalignment counter. In one embodiment, the memory cells in memory device 130 can be grouped into virtual memory blocks (e.g., virtual blocks). Each of the virtual blocks can be identified using virtual block numbers. In one embodiment, the processing device determines the virtual block that is associated with the selected sector based on logical block addressing (LBA). The virtual blocks can also be associated with misalignment factors and misalignment counters, respectively. In one embodiment, the processing device stores, in a misalignment table, the misalignment factors and the misalignment counters associated with the virtual blocks as metadata. The misalignment table can be stored in the remap component 113 or local memory 119.

At operation 230, the processing device determines if the misalignment counter satisfies a threshold criterion. In one example, the threshold criterion is satisfied when the misalignment counter being greater than a predetermined threshold. The predetermined threshold can be internally set. The predetermined threshold can be application specific. The predetermined threshold can also configurable. In one embodiment, the predetermined threshold can be an 8-bit count (ranging between 0 to 255).

In response to determining that the misalignment counter satisfying the threshold criterion, as shown at operation 240, the processing device generates an updated sector number by shifting the sector number by the misalignment factor and performs the access to the selected sector using the updated sector number. In one example, the misalignment counter satisfying the threshold criterion (e.g., the misalignment counter being greater than the predetermined threshold) indicates to the processing device that the misalignment counter can no longer be incremented such that each access in the virtual block is to be shifted by the misalignment factor. In one embodiment, the processing device shifts the sector number by the misalignment factor by increasing the sector number by the misalignment factor.

Further, as shown at operation 250, in response to determining that the misalignment counter does not satisfy the threshold criterion (e.g., the misalignment counter is not greater than the predetermined threshold), the processing device updates the misalignment counter and performs the access to the selected sector using the sector number.

Figure 3:
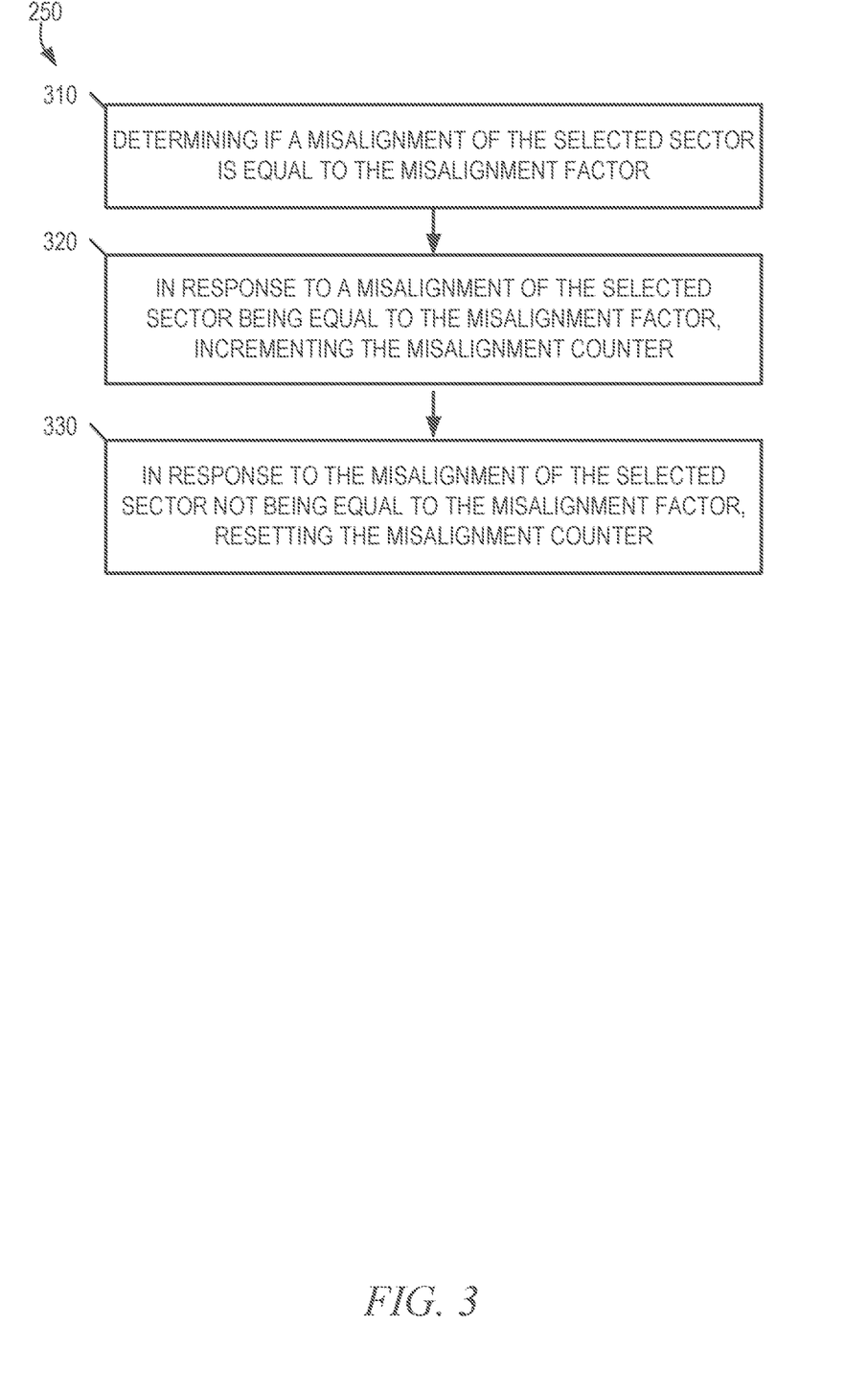
FIG. 3 is a flow diagram of an example method to update the misalignment counter at operation 250 in FIG. 2 in accordance with some embodiments of the present disclosure.

FIG. 3 is a flow diagram of an example method to update the misalignment counter at operation 250 in FIG. 2 in accordance with some embodiments of the present disclosure. The method in FIG. 3 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method in FIG. 3 is performed by the remap component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The processing device determines if a misalignment of the selected sector is equal to the misalignment factor, as shown in operation 310. The misalignment of the selected sector can be based on an address misalignment between a host starting address and a logical starting address internally set by the processing device.

In response to determining that the misalignment of the selected sector is equal to the misalignment factor, the processing device increments the misalignment counter at operation 320.

Further, in response to determining that the misalignment of the selected sector is not equal to the misalignment factor, the processing device, at operation 330, resets the misalignment counter. In one embodiment, in response to determining that the misalignment of the selected sector is not equal to the misalignment factor, the processing device further updates the misalignment factor by setting the misalignment factor to the misalignment of the selected sector.

Figure 4:
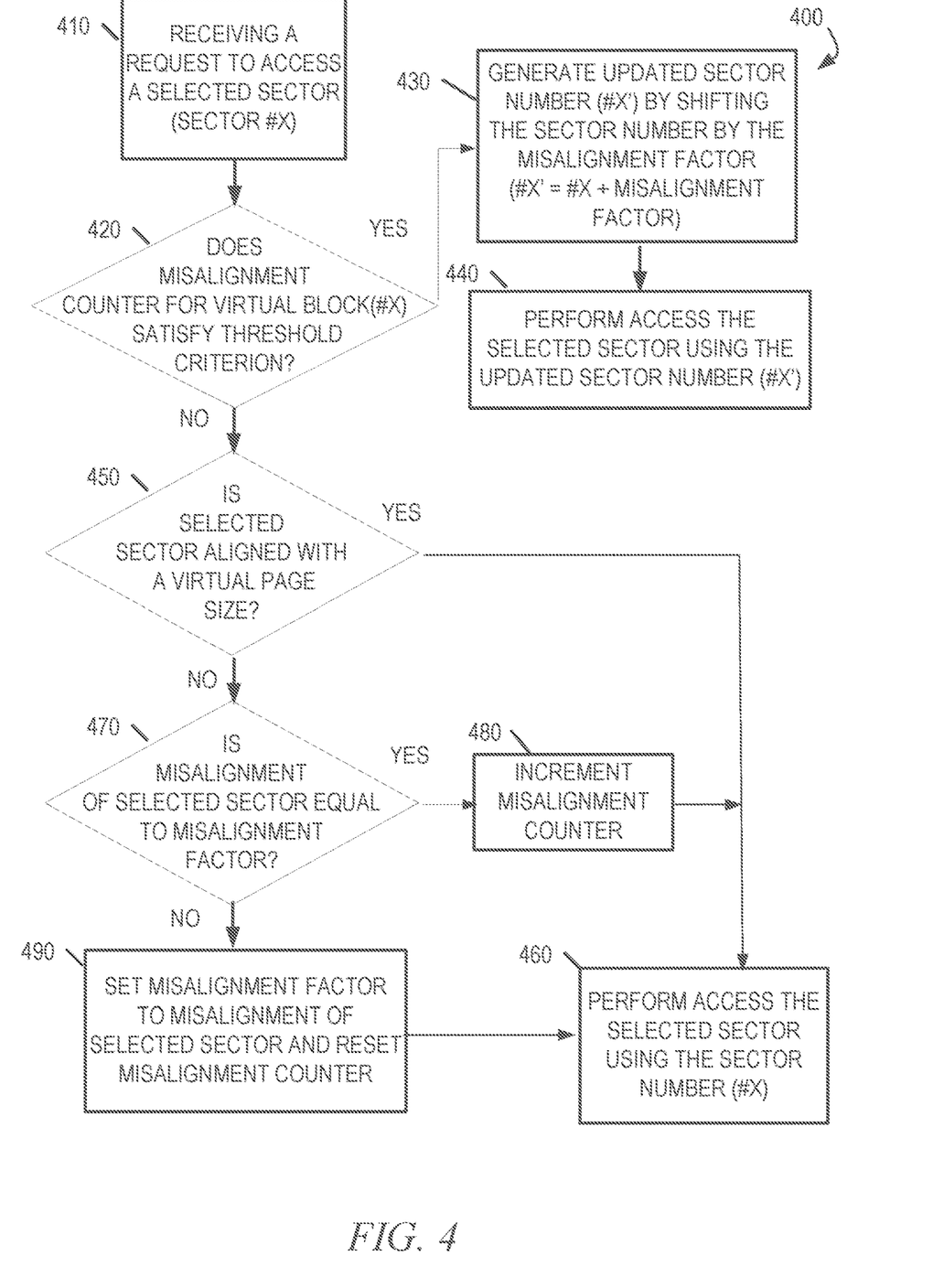
FIG. 4 is a flow diagram of an example method to manage remapping for a misaligned memory component in accordance with some embodiments of the present disclosure.

FIG. 4 is a flow diagram of an example method to manage remapping for a misaligned memory component in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the remap component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device receives a request to access a selected sector in a memory component. The selected sector can be associated with a sector number. The processing device can receive the request to access the selected sector from a host system 120. The request to access the selected sector can be a read access or a write access. In one embodiment, the request to access the selected sector includes the sector number.

The processing device, as shown in operation 420, determines a virtual block corresponding to the selected sector and determines if the misalignment counter associated with the virtual block satisfies the threshold criterion. For example, the processing device can determine whether the misalignment counter is greater than a predetermined threshold. In addition to the misalignment counter, the virtual block can also be associated with a virtual block number and a misalignment factor.

In response to determining that the misalignment counter satisfies the threshold criterion (e.g., the misalignment counter is greater than the predetermined threshold) at operation 420, the processing device generates an updated sector number by shifting the sector number by the misalignment factor (see operation 430). In one embodiment, the processing device shifts the sector number by the misalignment factor by increasing the sector number by the misalignment factor. The processing device performs the access to the selected sector using the updated sector number, as shown in operation 440.

In response to determining that the misalignment counter does not satisfy the threshold criterion (e.g., the misalignment counter is not greater than the predetermined threshold) at operation 420, the processing device, at operation 450, determines if the selected sector is aligned with a virtual page size in the virtual block. Each of the virtual blocks in the memory component can comprise virtual memory pages (e.g., virtual pages). Each of the virtual pages can comprise the one or more sectors of the memory device 130. Each of the virtual pages can be the same size. The size of the virtual page is referred to as a virtual page size. The virtual blocks, the virtual pages, and the sectors can refer to different units of the memory device 130 used to store data.

The processing device performs the access to the selected sector using the sector number, at operation 460, in response to determining that the selected sector is aligned with a virtual page size in the virtual block at operation 450.

The processing device determines if a misalignment of the selected sector is equal to the misalignment factor (see operation 470) in response to determining that the selected sector is not aligned with a virtual page size in the virtual block at operation 450. The misalignment of the selected sector can be based on an address misalignment between a host starting address and a logical starting address internally set by the processing device.

At operation 480, in response to determining that the misalignment of the selected sector is equal to the misalignment factor at operation 470, the processing device increments the misalignment counter, and at operation 460, the processing device performs the access to the selected sector using the sector number.

In response to determining that the misalignment of the selected sector is not equal to the misalignment factor at operation 470, the processing device, at operation 490, updates the misalignment factor by setting the misalignment factor to the misalignment of the selected sector and resets the misalignment counter. The processing device then performs the access to the selected sector using the sector number, at operation 460.

EXAMPLES

Example 1 is a system comprising: a memory component that comprises a plurality of sectors; and a processing device, operatively coupled with the memory component, to perform operations comprising: receiving a request to access a selected sector in the plurality of sectors, the selected sector being associated with a sector number; determining a virtual block corresponding to the selected sector, the virtual block being associated with a misalignment factor and a misalignment counter; determining if the misalignment counter is satisfies a threshold criterion; in response to the misalignment counter satisfying the threshold criterion, generating an updated sector number by shifting the sector number by the misalignment factor, and performing the access to the selected sector using the updated sector number; and in response to the misalignment counter not satisfying the threshold criterion, updating the misalignment counter, and performing the access to the selected sector using the sector number.

In Example 2, the operation of the updating of the misalignment counter in Example 1 optionally comprises: determining if a misalignment of the selected sector is equal to the misalignment factor; in response to the misalignment of the selected sector being equal to the misalignment factor, incrementing the misalignment counter; and in response to the misalignment of the selected sector not being equal to the misalignment factor, resetting the misalignment counter.

In Example 3, the operations in Example 2 optionally comprise, in response to the misalignment of the selected sector not being equal to the misalignment factor, setting the misalignment factor to the misalignment of the selected sector.

In Example 4, the misalignment of the selected sector in Example 2 optionally comprises the misalignment of the selected sector that is based on an address misalignment between a host starting address and a logical starting address internally set by the processing device.

In Example 5, the operations of Example 2 optionally comprise determining if the selected sector is aligned with a virtual page size in the virtual block; and in response to the selected sector being aligned with the virtual page size, maintaining the misalignment counter at a current count and performing the access to the selected sector using the sector number.

In Example 6, the operation of generating the updated sector number by shifting the sector number by the misalignment factor of Example 2 optionally comprises: increasing the sector number by the misalignment factor.

In Example 7, the request to access in Example 1 optionally comprises a read access or a write access.

In Example 8, the operations of Example 1 optionally comprise storing, in a misalignment table, a plurality of misalignment factors and a plurality of misalignment counters associated with a plurality of virtual blocks, respectively.

Example 9 is a method comprising: receiving a request to access a selected sector in the plurality of sectors, the selected sector being associated with a sector number; determining a virtual block corresponding to the selected sector, the virtual block being associated with a misalignment factor and a misalignment counter; determining if the misalignment counter satisfies a threshold criterion; in response to the misalignment counter satisfying the threshold criterion, generating an updated sector number by shifting the sector number by the misalignment factor, and performing the access to the selected sector using the updated sector number; and in response to the misalignment counter not satisfying the threshold criterion, updating the misalignment counter, and performing the access to the selected sector using the sector number.

In Example 10, the operation updating the misalignment counter in Example 9 optionally comprises: determining if a misalignment of the selected sector is equal to the misalignment factor; in response to the misalignment of the selected sector being equal to the misalignment factor, incrementing the misalignment counter; and in response to the misalignment of the selected sector not being equal to the misalignment factor, resetting the misalignment counter.

In Example 11, the operations of Example 10 optionally comprise, in response to the misalignment of the selected sector not being equal to the misalignment factor, setting the misalignment factor to the misalignment of the selected sector.

In Example 12, the misalignment of the selected sector in Example 10 is optionally based on an address misalignment between a host starting address and a logical starting address internally set by the processing device.

In Example 13, the operations of Example 10 optionally comprise determining if the selected sector is aligned with a virtual page size in the virtual block; and in response to the selected sector being aligned with the virtual page size, maintaining the misalignment counter at a current count and performing the access to the selected sector using the sector number.

In Example 14, the operation of shifting the sector number by the misalignment factor in Example 10 optionally comprises: increasing the sector number by the misalignment factor.

In Example 15, the request to access of Example 9 optionally comprises a read access or a write access.

In Example 16, the operations of Example 9 further comprise storing, in a misalignment table, a plurality of misalignment factors and a plurality of misalignment counters associated with a plurality of virtual blocks, respectively.

Example 17 is a non-transitory computer-readable storage medium comprising instructions that, when executed by a processing device, cause the processing device to perform operations comprising: receiving a request to access a selected sector in the plurality of sectors, the selected sector being associated with a sector number; determining a virtual block corresponding to the selected sector, the virtual block being associated with a misalignment factor and a misalignment counter; determining if the misalignment counter satisfies a threshold criterion; in response to the misalignment counter satisfying the threshold criterion, generating an updated sector number by shifting the sector number by the misalignment factor, and performing the access to the selected sector using the updated sector number; and in response to the misalignment counter not satisfying the threshold criterion, updating the misalignment counter, and performing the access to the selected sector using the sector number.

In Example 18, the operation of updating the misalignment counter of Example 17 optionally comprises determining if a misalignment of the selected sector is equal to the misalignment factor; in response to the misalignment of the selected sector being equal to the misalignment factor, incrementing the misalignment counter; and in response to the misalignment of the selected sector not being equal to the misalignment factor, resetting the misalignment counter.

In Example 19, the operations of Example 18 optionally comprise, in response to the misalignment of the selected sector not being equal to the misalignment factor, setting the misalignment factor to the misalignment of the selected sector.

In Example 20, the operations of Example 18 optionally comprise: determining if the selected sector is aligned with a virtual page size in the virtual block; and in response to the selected sector being aligned with the virtual page size, maintaining the misalignment counter at a current count and performing the access to the selected sector using the sector number.

Figure 5:
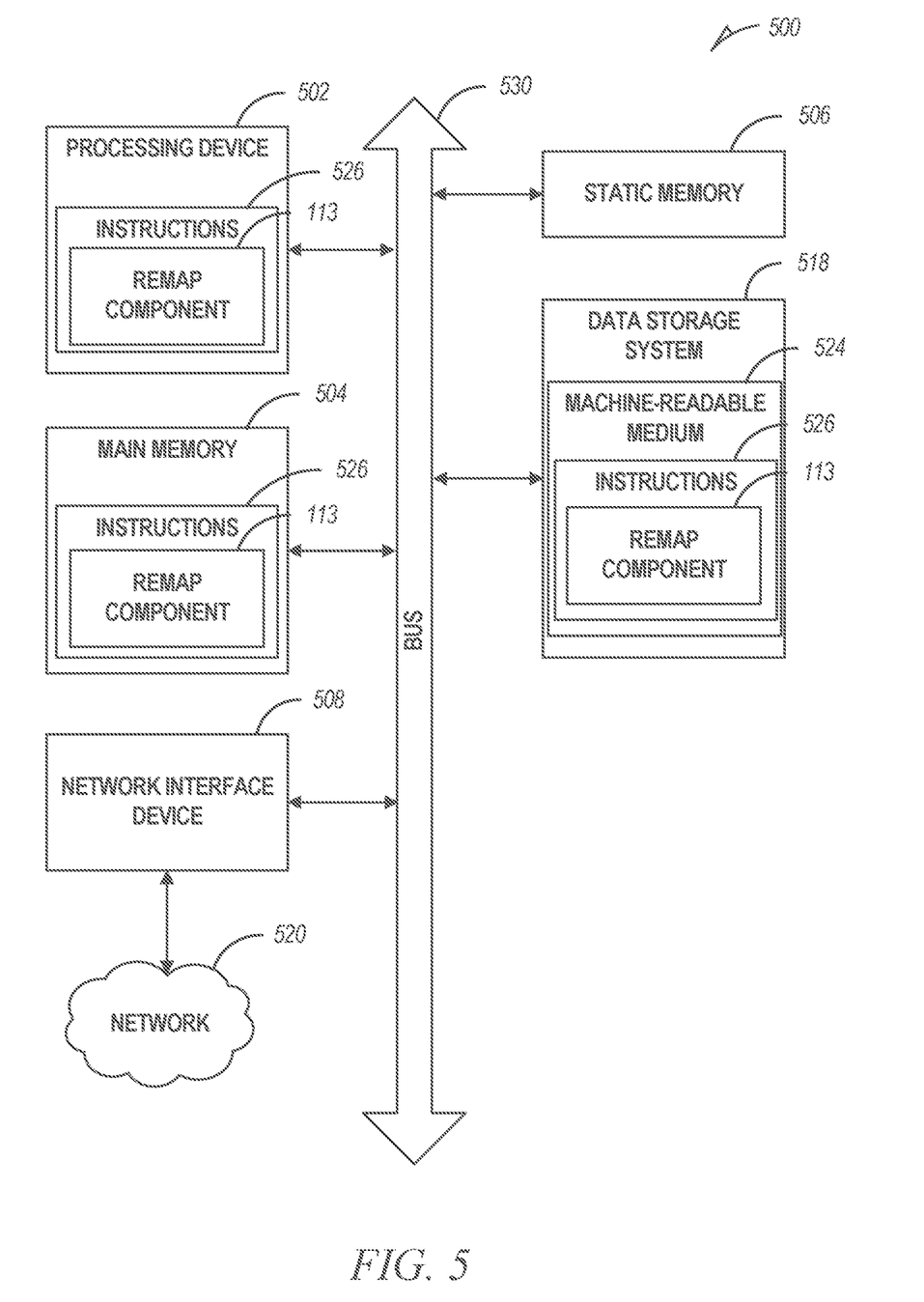
FIG. 5 is a block diagram of an example computer system in which embodiments of the present disclosure may operate.

FIG. 5 illustrates an example machine of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the remap component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a remap component (e.g., the remap component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

The invention claimed is:

1. A system comprising:
a memory component comprising a plurality of sectors; and
a processing device, operatively coupled with the memory component, to perform operations comprising:
receiving a request to access a selected sector in the plurality of sectors, the selected sector being associated with a sector number;
determining a virtual block corresponding to the selected sector, the virtual block being associated with a misalignment factor and a misalignment counter;
determining if the misalignment counter satisfies a threshold criterion; and
in response to the misalignment counter not satisfying the threshold criterion,
performing the access to the selected sector using the sector number.

2. The system of claim 1, wherein the processing device is further configured to perform operations further comprising:
in response to the misalignment counter not satisfying the threshold criterion,
updating the misalignment counter,
wherein updating the misalignment counter further comprises:
determining if a misalignment of the selected sector is equal to the misalignment factor,
in response to the misalignment of the selected sector being equal to the misalignment factor,
incrementing the misalignment counter, and
in response to the misalignment of the selected sector not being equal to the misalignment factor, resetting the misalignment counter.

3. The system of claim 2, wherein, in response to the misalignment of the selected sector not being equal to the misalignment factor, the processing device to perform operations further comprising:
setting the misalignment factor to the misalignment of the selected sector.

4. The system of claim 2, wherein the misalignment of the selected sector is based on an address misalignment between a host starting address and a logical starting address internally set by the processing device.

5. The system of claim 2, wherein the processing device is further configured to perform operations further comprising:
determining if the selected sector is aligned with a virtual page size in the virtual block; and
in response to the selected sector being aligned with the virtual page size, maintaining the misalignment counter at a current count and performing the access to the selected sector using the sector number.

6. The system of claim 1, wherein the processing device is further configured to perform operations further comprising:
in response to the misalignment counter satisfying the threshold criterion,
generating an updated sector number based on the sector number and the misalignment factor; and performing the access to the selected sector using the updated sector number.

7. The system of claim 1, wherein the request to access is a read access or a write access.

8. The system of claim 1, wherein the processing device is further configured to perform operations further comprising:
storing, in a misalignment table, a plurality of misalignment factors and a plurality of misalignment counters associated with a plurality of virtual blocks, respectively.

9. A method comprising:
receiving a request to access a selected sector in a plurality of sectors, the selected sector being associated with a sector number;
determining a virtual block corresponding to the selected sector, the virtual block being associated with a misalignment factor and a misalignment counter;
determining if the misalignment counter satisfies a threshold criterion; and
in response to the misalignment counter not satisfying the threshold criterion,
performing the access to the selected sector using the sector number.

10. The method of claim 9, further comprising:
updating the misalignment counter in response to the misalignment counter not satisfying the threshold criterion, wherein updating the misalignment counter further comprises:
determining if a misalignment of the selected sector is equal to the misalignment factor,
in response to the misalignment of the selected sector being equal to the misalignment factor, incrementing the misalignment counter, and
in response to the misalignment of the selected sector not being equal to the misalignment factor, resetting the misalignment counter.

11. The method of claim 10, further comprising:
in response to the misalignment of the selected sector not being equal to the misalignment factor,
setting the misalignment factor to the misalignment of the selected sector.

12. The method of claim 10, wherein the misalignment of the selected sector is based on an address misalignment between a host starting address and a logical starting address internally set by a processing device.

13. The method of claim 10, further comprising:
determining if the selected sector is aligned with a virtual page size in the virtual block; and
in response to the selected sector being aligned with the virtual page size, maintaining the misalignment counter at a current count and performing the access to the selected sector using the sector number.

14. The method of claim 9, further comprising:
in response to the misalignment counter satisfying the threshold criterion,
generating an updated sector number based on the sector number and the misalignment factor, and performing the access to the selected sector using the updated sector number.

15. The method of claim 9, wherein the request to access is a read access or a write access.

16. The method of claim 9, further comprising:
storing, in a misalignment table, a plurality of misalignment factors and a plurality of misalignment counters associated with a plurality of virtual blocks, respectively.

17. At least one non-transitory machine-readable storage medium comprising instructions that, when executed by a processing device, cause the processing device to perform operations comprising:
receiving a request to access a selected sector in a plurality of sectors, the selected sector being associated with a sector number;
determining a virtual block corresponding to the selected sector, the virtual block being associated with a misalignment factor and a misalignment counter;
determining if the misalignment counter satisfies a threshold criterion; and
in response to the misalignment counter not satisfying the threshold criterion,
performing the access to the selected sector using the sector number.

18. The at least one non-transitory machine-readable storage medium of claim 17, wherein the processing device performs operations further comprising:
in response to the misalignment counter not satisfying the threshold criterion, updating the misalignment counter, wherein updating the misalignment counter further comprises:
determining if a misalignment of the selected sector is equal to the misalignment factor,
in response to the misalignment of the selected sector being equal to the misalignment factor, incrementing the misalignment counter, and
in response to the misalignment of the selected sector not being equal to the misalignment factor, resetting the misalignment counter.

19. The at least one non-transitory machine-readable storage medium of claim 18, wherein, in response to the misalignment of the selected sector not being equal to the misalignment factor, the processing device performs operations further comprising:
setting the misalignment factor to the misalignment of the selected sector.

20. The at least one non-transitory machine-readable storage medium of claim 18, wherein the processing device performs operations further comprising:
determining if the selected sector is aligned with a virtual page size in the virtual block; and
in response to the selected sector being aligned with the virtual page size, maintaining the misalignment counter at a current count and performing the access to the selected sector using the sector number.

* * * * *